US009698753B2

(12) United States Patent
Burak

(10) Patent No.: US 9,698,753 B2
(45) Date of Patent: Jul. 4, 2017

(54) LATERALLY COUPLED RESONATOR FILTER HAVING APODIZED SHAPE

(71) Applicant: Avago Technologies General IP (Singapore) Pte. Ltd., Singapore (SG)

(72) Inventor: Dariusz Burak, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 270 days.

(21) Appl. No.: 14/219,866

(22) Filed: Mar. 19, 2014

(65) Prior Publication Data

US 2015/0270826 A1    Sep. 24, 2015

(51) Int. Cl.
| | |
|---|---|
| H03H 9/02 | (2006.01) |
| H03H 9/145 | (2006.01) |
| H03H 9/54 | (2006.01) |
| H03H 9/58 | (2006.01) |
| H03H 9/64 | (2006.01) |

(52) U.S. Cl.
CPC .... H03H 9/02228 (2013.01); H03H 9/02992 (2013.01); H03H 9/14558 (2013.01); H03H 9/547 (2013.01); H03H 9/584 (2013.01); H03H 9/6426 (2013.01)

(58) Field of Classification Search
CPC ........... H03H 9/02716; H03H 9/14547; H03H 9/14558; H03H 9/02228; H03H 9/02992; H03H 9/547; H03H 9/584; H03H 9/6426
USPC ..... 333/133, 193–196, 186–188; 310/313 A, 310/313 B, 313 D
See application file for complete search history.

(56) References Cited

U.S. PATENT DOCUMENTS

| | | | |
|---|---|---|---|
| 5,587,620 A | 12/1996 | Ruby et al. | |
| 5,873,153 A | 2/1999 | Ruby et al. | |
| 6,107,721 A | 8/2000 | Lakin | |
| 6,215,375 B1 | 4/2001 | Larson, III et al. | |
| 6,384,697 B1 | 5/2002 | Ruby | |
| 6,507,983 B1 | 1/2003 | Ruby et al. | |
| 6,548,943 B2 | 4/2003 | Kaitila et al. | |
| 6,791,236 B1* | 9/2004 | Abramov | 310/313 B |

(Continued)

FOREIGN PATENT DOCUMENTS

JP    2013-110735    6/2013

OTHER PUBLICATIONS

Giovannini et al. "Spurious Mode Suppression via Apodization for 1 GHz AlN Contour-Mode Resontors", May 2012, 2012 IEEE International Frequency Control Symposium Proceedings, pp. 1-5.*

(Continued)

*Primary Examiner* — Robert Pascal
*Assistant Examiner* — Jorge Salazar, Jr.

(57) ABSTRACT

A laterally coupled resonator filter device includes a bottom electrode, a piezoelectric layer disposed on the bottom electrode, and a top contour electrode disposed on the piezoelectric layer. The top contour electrode includes first and second top comb electrodes. The first top comb electrode include a first top bus bar and multiple first top fingers extending in a first direction from the first top bus bar. The second top comb electrode includes a second top bus bar and multiple second top fingers extending in a second direction from the second top bus bar, the second direction being substantially opposite to the first direction such that the first and second top fingers form a top interleaving pattern providing an acoustic filter having an apodized shape.

19 Claims, 8 Drawing Sheets

(56) References Cited

U.S. PATENT DOCUMENTS

| | | | |
|---|---|---|---|
| 6,936,837 | B2 | 8/2005 | Yamada et al. |
| 7,275,292 | B2 | 10/2007 | Ruby et al. |
| 7,280,007 | B2 | 10/2007 | Feng et al. |
| 7,345,410 | B2 | 3/2008 | Grannen et al. |
| 7,388,454 | B2 | 6/2008 | Ruby et al. |
| 7,629,865 | B2 | 12/2009 | Ruby |
| 7,758,979 | B2 | 7/2010 | Akiyama et al. |
| 8,058,768 | B2 * | 11/2011 | Milsom .............. H03H 9/02228 310/313 B |
| 9,093,979 | B2 * | 7/2015 | Wang .................... H03H 9/584 |
| 2007/0205850 | A1 | 9/2007 | Jamneala et al. |
| 2008/0258842 | A1 | 10/2008 | Ruby et al. |
| 2010/0007444 | A1 * | 1/2010 | Nordin et al. ................ 333/195 |
| 2010/0102901 | A1 | 4/2010 | Tsuda |
| 2010/0327697 | A1 | 12/2010 | Choy et al. |
| 2010/0327994 | A1 | 12/2010 | Choy et al. |
| 2011/0273061 | A1 * | 11/2011 | Thalmayr .......... H03H 9/02275 310/346 |
| 2012/0050236 | A1 * | 3/2012 | Lo ........................ H01P 1/2135 345/204 |
| 2013/0321100 | A1 | 12/2013 | Wang |

OTHER PUBLICATIONS

Zuo et al. "Single-ended-to-differential and differential-to-differential channel-select filters based on piezoelectric AlN contour-mode MEMS resonators", Jun. 2012, 2010 IEEE International Frequency Control Symposium, pp. 5-8.*

Ranjan et al. "Strained Hexagonal ScN: A Material with Unusual Structural and Optical Properties," Physical Review Letters, Jun. 27, 2003, vol. 90, No. 25, The American Physical Society, USA.

Farrer et al., "Properties of hexagonal ScN versus wurtzite GaN and InN," Physical Review B, Nov. 20, 2002, vol. 66, No. 20, The American Physical Society, USA.

Constantin et al., "Composition-dependent structural properties in ScGaN alloy films: A combined experimental and theoretical study," Journal of Applied Physics, Dec. 16, 2005, vol. 98, No. 12, American Institute of Physics, USA.

Akiyama et al., "Enhancement of piezoelectric response in scandium aluminum nitride alloy thin films prepared by dual reactive cosputtering," Advanced Materials, 2009, vol. 21, pp. 593-596, Japan.

Suzuki et al., "Influence of shadowing effect on shear mode acoustic properties in the c-axis tilted AlN films," IEEE Ultrasonics Symposium (IUS), 2010, pp. 1478-1481.

Yanagitani et al., "Giant shear mode electromechanical coupling coefficient k12 in c-axis tilted ScAlN films," IEEE Ultrasonics Symposium (IUS), 2010.

German Office Action dated Oct. 24, 2014.

Co-pending U.S Appl. No. 13/662,460, filed Oct. 27, 2012.

Co-pending U.S Appl. No. 13/662,425, filed Oct. 27, 2012.

Vikram A. Thaker, "Acoustically Coupled Thickness-Mode AlN-on-Si Band-Pass Filters—Part II: Simulation and Analysis", IEEE Transactions on Ultrasonics, Ferroelectrics, and Frequency Control, vol. 59, No. 10, Oct. 2012, pp. 2270-2277.

Co-pending U.S. Appl. No. 13/658,024, filed Oct. 23, 2012.

Co-pending U.S. Appl. No. 13/663,449, filed Oct. 29, 2012.

Co-pending U.S. Appl. No. 13/660,941, filed Feb. 28, 2011.

Co-pending U.S. Appl. No. 13/654,718, filed Oct. 18, 2012.

* cited by examiner

LATERALLY COUPLED RESONATOR FILTER HAVING APODIZED SHAPE

BACKGROUND

An acoustic resonator may act as a transducer that converts electrical signals into acoustic signals and/or vice versa. Examples of acoustic resonators include bulk acoustic wave (BAW) resonators, such as thin film bulk acoustic resonators (FBARs) and surface mounted resonators (SMRs), as well as surface acoustic wave (SAW) resonators. Acoustic resonators may used in a wide variety of electronic applications, such as cellular telephones, personal digital assistants (PDAs), electronic gaming devices, laptop computers, and other portable communications devices. For example, FBARs are commonly used to implement electrical filters, duplexers and voltage transformers in the above and other applications.

An acoustic resonator typically comprises a layer of piezoelectric material arranged between two conductive plates or electrodes, which may form a thin membrane. Two acoustic resonators can be coupled acoustically to form an electrical filter. When stimulated with a time-varying input signal from an input terminal of the electrodes, the piezoelectric material vibrates at a resonance frequency determined by physical properties of the acoustic resonator, such as its geometry and composition. This vibration produces a time-varying output signal at an output terminal of the electrodes.

One type of electrical filter implemented by acoustic resonators is a laterally coupled resonator filter (LCRF), which typically includes a ground plane, a piezoelectric layer and a set of interdigital top comb electrodes having interlaced comb-like fingers. Generally, an electrical signal is applied to one of the top comb electrodes of an LCRF, which excites Mason (or piston) mode under that electrode. Generally, Mason mode undergoes scattering at the electrode edges and produces spurious modes in the fingers and corresponding gaps between the fingers. The spurious modes in the gaps propagate to the fingers of the other top comb electrode, exciting motion. Voltage is generated by the excited motion, which is picked up as a transmitted signal.

There are a number of advantages to using an LCRF over other types of acoustic resonator filters, such as ladder filters formed of series and shunt resonators (e.g., FBARs) interconnected in a ladder-type structure. For example, the process of fabricating an LCRF is relatively simple, in that it essentially involves only top electrode patterning. Also, there is no need for mass-loading of various ones of the series and shunt resonators, and there may be a reduction in physical space required for the filter. However, LCRFs are generally difficult to design with regard to specific passbands. In comparison, a typical ladder filter requires only one-dimensional Mason model simulations, whereas an LCRF requires two-dimension or even three-dimensional finite element method (FEM) model simulations. Also, spurious pass-bands may be present in various spectral regions. The embodiments described herein address these and other issues, including suppression of spurious pass-bands, through apodization of LCRF geometry.

BRIEF DESCRIPTION OF THE DRAWINGS

The disclosed embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
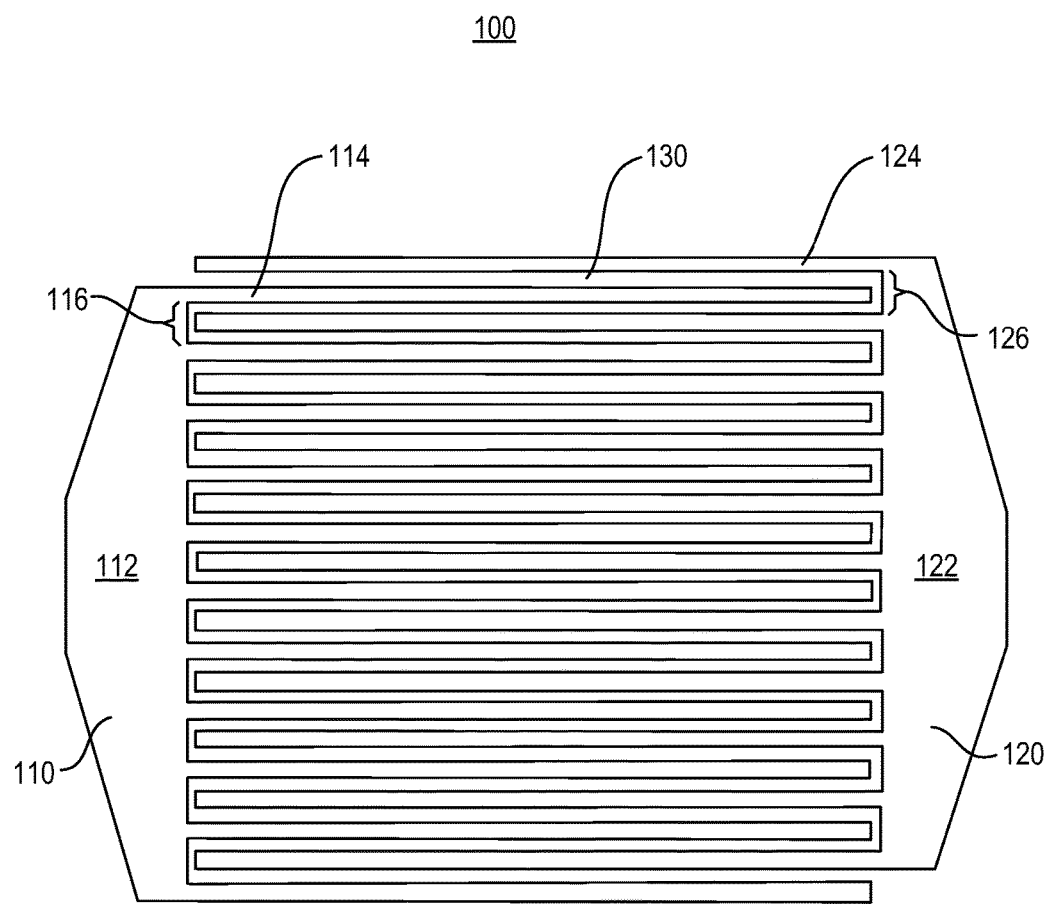
FIG. 1 is a top plan view of a conventional laterally coupled resonator filter (LCRF) device.

In the following detailed description, for purposes of explanation and not limitation, representative embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Relative terms, such as "above," "below," "top," "bottom," "upper", "lower", "left", and "right" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would then be below that element.

The various embodiments relate generally to acoustic resonator filters. In certain embodiments, a laterally coupled resonator filter device includes a bottom electrode, a piezoelectric layer disposed on the bottom electrode, and a top contour electrode disposed on the piezoelectric layer, the top contour electrode comprising first and second top comb electrodes. The first top comb electrode includes a first top bus bar and a plurality of first top fingers extending in a first direction from the first top bus bar. The second top comb electrode includes a second top bus bar and a plurality of second top fingers extending in a second direction from the second top bus bar, the second direction being substantially opposite to the first direction such that the first and second top fingers form a top interleaving pattern providing an acoustic filter having an apodized shape.

According to a representative embodiment, an LCRF device includes a bottom electrode, a piezoelectric layer disposed on the bottom electrode, and a top contour electrode disposed on the piezoelectric layer. The top contour electrode includes a first top comb electrode comprising a first top bus bar and a plurality of first top fingers extending in a first direction from the first top bus bar; and a second top comb electrode comprising a second top bus bar and a plurality of second top fingers extending in a second direction from the second top bus bar, the second direction being substantially opposite to the first direction such that the first and second top fingers form a top interleaving pattern providing an acoustic filter having an apodized shape.

According to another representative embodiment, an LCRF device includes a ground plane, a piezoelectric layer disposed on the ground plane, and a top contour electrode disposed on the piezoelectric layer. The top contour electrode comprises a set of interlaced first and second comb-like fingers extending from first and second top bus bars, respectively. The first comb-like fingers are configured to receive an electrical signal and the second comb-like fingers are configured to resonate in response to the first comb-like fingers receiving the electrical signal. The set of interlaced first and second comb-like fingers has an apodized shape resulting from at least one of gaps varying lengthwise between adjacent first and second comb-like fingers, widths of the first and second comb-like fingers varying lengthwise, and skewed edges of at least one of the first and second top bus bars.

According to another representative embodiment, an LCRF includes a plurality of first top fingers extending away from a first top bus bar of a first top comb electrode formed over a piezoelectric layer, the first top fingers being separated by first spaces, respectively; and a plurality of second top fingers extending away from a second top bus bar of a second top comb electrode formed over the piezoelectric layer, the second top fingers being separated by second spaces, respectively. The first top fingers extend from the first top bus bar into the second spaces, and the second top fingers extend from the second top bus bar into the first spaces to form a top interleaving pattern having an apodized shape.

The described embodiments may provide several potential benefits relative to conventional technologies. For example, representative embodiment of acoustic filters described below may be produced with a smaller die size compared with conventional acoustic filters. This results in reduction of a number of factors, such as footprint, power consumption, and cost. Certain embodiments can also be used to efficiently implement common circuit functions, such as single-ended to differential signal conversion or impedance transformation. In addition, certain embodiments can be used to implement electrical components for wide band applications. Finally, the above and other benefits can be achieved in certain embodiments by a relatively simple structure and corresponding fabrication process, as will be apparent from the following description.

Certain aspects of the present teachings relate generally to acoustic resonators and acoustic resonator filters, which may include film bulk acoustic wave resonators (FBARs) or solidly mounted resonators (SMRs). Certain details of acoustic resonators, including materials and methods of fabrication, may be found in one or more of the following commonly owned U.S. patents and patent applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. Patent App. Pub. No. 2010/0327697 to Choy et al.; U.S. Patent App. Pub. No. 2010/0327994 to Choy et al., U.S. patent application Ser. No. 13/658,024 to Nikkel et al. (issued as U.S. Pat. No. 9,385,684 on Jul. 5, 2016); U.S. patent application Ser. No. 13/663,449 to Burak et al. (issued as U.S. Pat. No. 9,401,692 on Jul. 26, 2016); U.S. patent application Ser. No. 13/660,941 to Burak et al. (issued as U.S. Pat. No. 9,425,764 on Aug. 23, 2016); U.S. patent application Ser. No. 13/654,718 to Burak et al. (issued as U.S. Pat. No. 9,099,983 on Aug. 4, 2015); U.S. Patent App. Pub. No. 2008/0258842 to Ruby et al.; and U.S. Pat. No. 6,548,943 to Kaitila et al. The disclosures of these patents and patent applications are hereby specifically incorporated by reference in their entireties. It is emphasized that the components, materials and method of fabrication described in these patents and patent applications are representative and other methods of fabrication and materials within the purview of one of ordinary skill in the art are contemplated.

FIG. 1 is a top plan view of a conventional laterally coupled resonator filter (LCRF) device having interleaving electrodes.

Referring to FIG. 1, LCRF device 100 includes first top comb electrode 110 and second top comb electrode 120. The first top comb electrode 110 includes a first top bus bar 112 and multiple first top comb extensions or comb-like fingers (indicated by representative first top finger 114) respectively separated by spaces (indicated by representative first space 116). The first top fingers 114 extend in a first direction from the first top bus bar 112 (e.g., left to right in the illustrative orientation). The second top comb electrode 120 includes a second top bus bar 122 and multiple second top comb extensions or comb-like fingers (indicated by representative second top finger 124) respectively separated by spaces (indicated by representative second space 126). The second top fingers 124 extend in a second direction, opposite the first direction, from the second top bus bar 122 (e.g., right to left in the illustrative orientation). The first top fingers 114 of the first top comb electrode 110 extend within the second spaces 126 between the second top fingers 124 of the second top comb electrode 120, and vice versa, thereby forming a top interleaving pattern of the LCRF device 100, where alternating first and second top fingers 114 and 124 are separated by gaps 130.

Notably, the edges of the first and second top fingers 114 and 124 are parallel to one another. This includes the side edges of the first and second top fingers 114 and 124 that extend lengthwise along first and second directions, respectively, as well as the end edges of the first and second top fingers 114 and 124 that are perpendicular to the side edges, respectively. Further, looking at the LCRF device 100 as a whole, there are also parallel edges. For example, the side edge of an outermost first top finger 114 (depicted at the bottom of FIG. 1) is parallel to the side edge of an outermost second top finger 124 (depicted at the top of FIG. 1). Accordingly, the interleaving pattern of the first and second top fingers 114 and 124 and the LCRF device 100 are not apodized. "Apodized," in this context, means that none of the outer edges of the filter are parallel to one another. Generally, in a conventional non-apodized LCRF, spurious resonance may be present outside of the main pass-band of the filter. However, apodization of LCRF geometry, as in the embodiments discussed below, may allow for suppression of such out-of-band spurious resonances.

Figure 2:
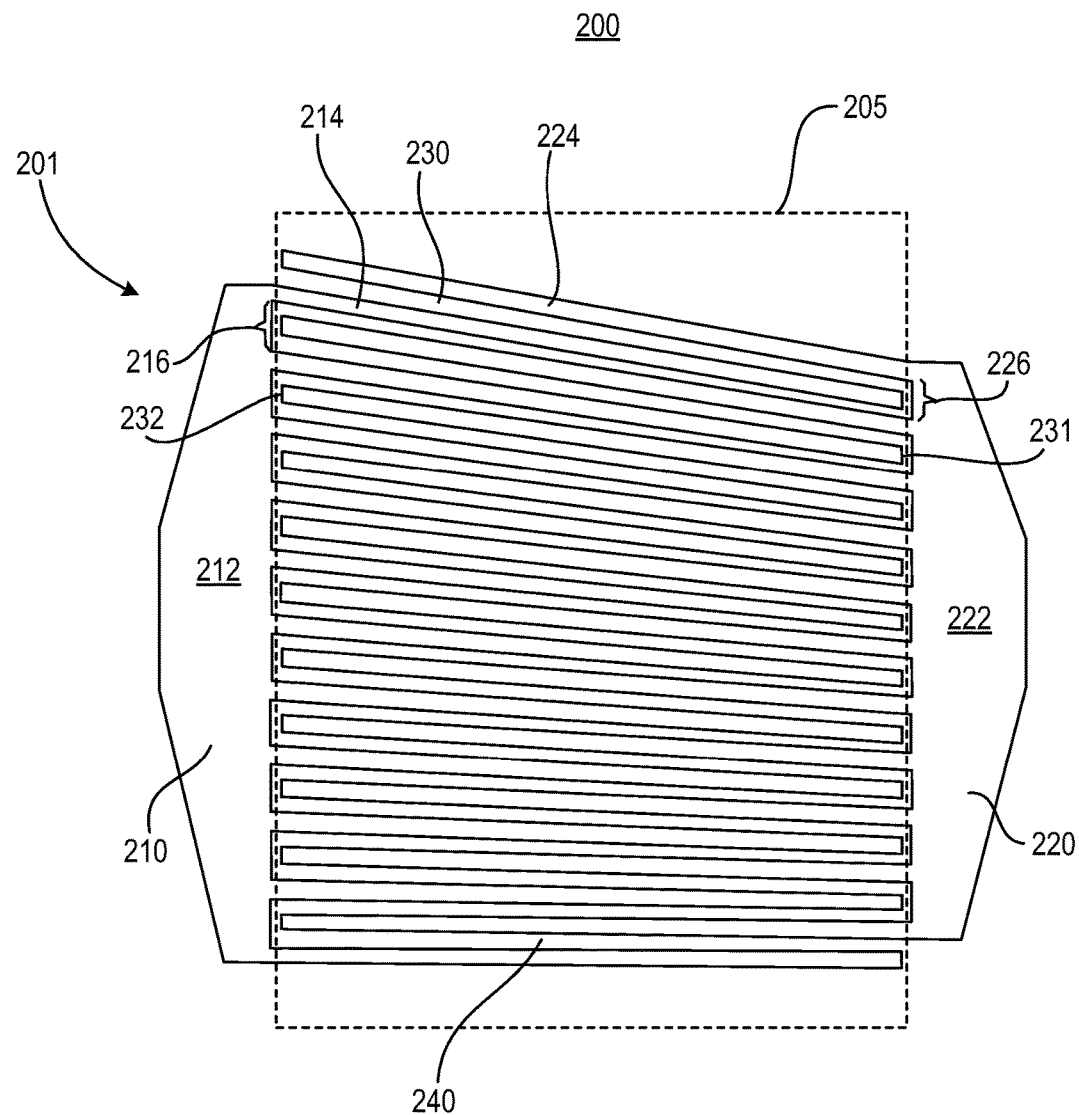
FIG. 2 is a top plan view of an LCRF device having an LCRF with an apodized shape, according to a representative embodiment.

FIG. 2 is a top plan view of an LCRF device having an LCRF with an apodized shape, based on varying gap widths, according to a representative embodiment. Certain details of the use of apodization in acoustic resonators may be found in commonly owned U.S. Pat. No. 6,215,375 to Larson III, et al. and commonly owned U.S. Pat. No. 7,629,865 to Ruby, the disclosures of which are hereby incorporated herein by reference in their entireties.

Referring to FIG. 2, LCRF device 200 includes top contour electrode 201, which combines first top comb electrode 210 and second top comb electrode 220. The first top comb electrode 210 includes a first top bus bar 212 and multiple first top comb extensions or comb-like fingers (indicated by representative first top finger 214), which extend in a first direction away from the first top bus bar 212 (e.g., generally left to right in the illustrative orientation). More specifically, proximal ends of the first top fingers 214 are connected to the first top bus bar 212, and separated from one another by first spaces (indicated by representative first space 216). Distal ends of the first top fingers 214 are not connected to any bus bar, such as second top bus bar 222. The second top comb electrode 220 includes the second top bus bar 222 and multiple second top comb extensions or comb-like fingers (indicated by representative second top finger 224), which extend in a second direction away from the second top bus bar 222 (e.g., generally right to left in the illustrative orientation). Proximal ends of the second top fingers 224 are connected to the second top bus bar 222, and separated from one another by second spaces (indicated by representative second space 226). Distal ends of the second top fingers 224 are not connected to any bus bar, such as the first top bus bar 212. In the depicted embodiment, the second direction is substantially opposite the first direction (as opposed to exactly opposite the first direction) because the first and second directions are slightly skewed with respect to one another due to the apodized geometry, as discussed below.

The top contour electrode 201 is interdigital in that the first top fingers 214 of the first top comb electrode 210 extend within the second spaces 226 formed between adjacent second top fingers 224, and the second top fingers 224 of the second top comb electrode 220 extend within the first spaces 216 formed between adjacent first top fingers 214, thereby forming a top interleaving pattern in the top contour electrode 201. The first and second top bus bars 212 and 222 are mass loaded, so that they have different resonance frequencies than the first and second top fingers 214 and 224. Therefore, the top interleaving pattern of the first and second top fingers 214 and 224, located between the mass loaded first and second top bus bars 212 and 222, form an acoustic filter, is indicated as resonator filter LCRF 205. That is, the LCRF 205 comprises alternating first and second top fingers 214 and 224 separated lengthwise by gaps 230. Also, since the distal ends of the first and second top fingers 214 and 224 do not contact the second and first top bus bars 222 and 212, respectively, the distal ends of the first top fingers 214 are separated from the second top bus bar 222 by end gap 231 and the distal ends of the second top fingers 224 are separated from the first top bus bar 212 by end gap 232.

For purposes of illustration, FIG. 2 depicts a non-limiting example showing eleven first top fingers 214 and eleven second top fingers 224 alternating with the eleven first top fingers 214. Adjacent first and second top fingers 214 and 224 are respectively separated by twenty-one gaps 230. Of course, the numbers of first and second top fingers 214 and 224 and corresponding gaps 230 forming the LCRF 205 may vary without departing from the scope of the present teachings.

In the depicted embodiment, the apodized shape of the LCRF 205 is formed by varying the width of at least one of the gaps 230 along a lengthwise direction, while maintaining constant widths of the first and second top fingers 214 and 224. That is, the at least one gap 230 may become narrower as it extends from the first top bus bar 212 in the first direction (as shown in the example of FIG. 2), or the at least one gap 230 may become narrower as it extends from the second top bus bar 222 in the second direction. Stated differently, the at least one gap 230 may become wider as it extends from the second top bus bar 222 in the second direction (as shown in the example of FIG. 2), or the at least one gap 230 may become wider as it extends from the first top bus bar 212 in the first direction. The ends (proximal and distal) of each of the first and second top fingers 214 and 224 may be formed at right angles with respect to the sides of the corresponding first and second top fingers 214 and 224.

For purposes of illustration and ease of description, FIG. 2 shows a uniform pattern, where each of the gaps 230 separating adjacent first and second top fingers 214 and 224 have the same widths and width variations along the lengthwise direction. That is, each of the gaps 230 is wider near the first top bus bar 212 and narrows linearly in the lengthwise direction as it progresses toward the second top bus bar 222. Also, for purposes of illustration and ease of description, the end gaps 231 and 232 have the same widths. The changing widths of the gaps 230 cause the consecutive first and second top fingers 214 and 215 to skew upwards, such that the side edges of the bottom-most first top finger 214 and the top-most second top finger 224 (corresponding to outer edges of the LCRF 205) are not parallel. Further, the distal ends of each of the first and second top fingers 214 and 224 (also corresponding to outer edges of the LCRF 205) are formed at angles that avoid parallel outside edges, respectively. For example, the ends of each of the first and second top fingers 214 and 224 may be formed at right angles with respect to the sides of the corresponding first and second top fingers 214 and 224, so that they are likewise skewed with respect to one another. Accordingly, the LCRF 205 has an apodized shape.

In an illustrative configuration, each of the first and second top fingers 214 and 224 may have a constant width of approximately 3.0 µm, each of the gaps 230 may have a varying width that changes substantially linearly from approximately 3.5 μm at the first top bus bar 212 to approximately 2.5 μm at the second top bus bar 222, and each of the end gaps 231 and 232 may have a width of approximately 2.5 μm, for example. Of course, these dimensions may vary to provide unique benefits for any particular situation or to meet application specific design requirements of various implementations, as would be apparent to one skilled in the art. Also, the number of gaps 230 that vary in width, as well as the extent of the variation(s), may differ in various configurations without departing from the scope of the present teachings. Likewise, the widths and orientations of the end gaps 231 and 232 may vary, with respect to each other or among themselves, without departing from the scope of the present teachings, in order to maintain the apodized shape.

The top contour electrode 201 is formed over a piezoelectric layer 240, portions of which are visible through the gaps 230 in FIG. 2. The piezoelectric layer 240 is formed either on a single bottom electrode or ground plane (e.g., such as the bottom electrode shown in FIG. 6B) or on a bottom contour electrode (e.g., such as the bottom electrode shown in FIG. 7B), which combines first and second bottom comb electrodes in various similar manner, including the configuration described above with regard to the top contour electrode 201. The bottom electrode/contour electrode may be formed on a substrate (not shown).

With regard to all the various embodiments, including those depicted in FIGS. 2-7B, the substrate may be formed of various types of semiconductor materials compatible with semiconductor processes, such as silicon (Si), gallium arsenide (GaAs), indium phosphide (InP), or the like, for example, which is useful for integrating connections and electronics, thus reducing size and cost. The substrate alternatively may be formed of or otherwise include an insulating material, such as glass, sapphire, alumina or the like, for example. The bottom plane electrode/contour electrode may be formed on the substrate by sputter deposition, chemical vapor deposition (CVD) or other process, using one or more electrically conductive metal materials, such as tungsten (W), molybdenum (Mo), copper (Cu) or aluminum (Al), for example.

The piezoelectric layer (e.g., piezoelectric layer 240) may be formed on the bottom plane electrode/contour electrode by sputter deposition or other process using any piezoelectric material compatible with semiconductor processes, such as aluminum nitride (AlN), zinc oxide (ZnO), or lead zirconate titanate (PZT), for example. Of course, other materials may be incorporated into the piezoelectric layer without departing from the scope of the present teachings. Also, in various embodiments, the piezoelectric layer may be "doped" with one or more rare earth elements, such as scandium (Sc), yttrium (Y), lanthanum (La), or erbium (Er), for example. Examples of doping piezoelectric layers with one or more rare earth elements for improving electromechanical coupling coefficient Kt2, for example, are provided by U.S. patent application Ser. No. 13/662,425 (filed Oct. 27, 2012), to Bradley et al. (issued as U.S. Pat. No. 9,225, 313 on Dec. 29, 2015), and U.S. patent application Ser. No. 13/662,460 (filed Oct. 27, 2012), to Grannen et al. (issued as U.S. Pat. No. 9,136,819 on Sep. 15, 2015), which are hereby incorporated by reference in their entireties.

The top contour electrode (e.g., top contour electrode 201, 301, 401) may be formed on a top surface of the piezoelectric layer by sputter deposition, chemical vapor deposition (CVD) or other process, using one or more electrically conductive metal materials, such as tungsten (W), molybdenum (Mo), copper (Cu) or aluminum (Al), for example. Generally, a photoresist layer is applied to the top surface of the piezoelectric layer, and is then patterned to provide a photoresist pattern or photomask corresponding to the desired pattern of the top contour electrode (e.g., including the first and second top fingers). The photomask may be formed by machining or by chemically etching the photoresist layer using photolithography, although various alternative techniques may be incorporated. Portions the top contour electrode material is etched away through the photomask using a fluorine plasma etch, for example, although other types of etching may be incorporated, e.g., depending on the type of material, to provide the desired pattern of the top contour electrode. A similar process would be incorporated to fabricate a bottom contour electrode on a bottom surface of the piezoelectric layer (e.g., using flip-chip technology) in the event a bottom plane electrode or ground plane in not used.

Figure 3:
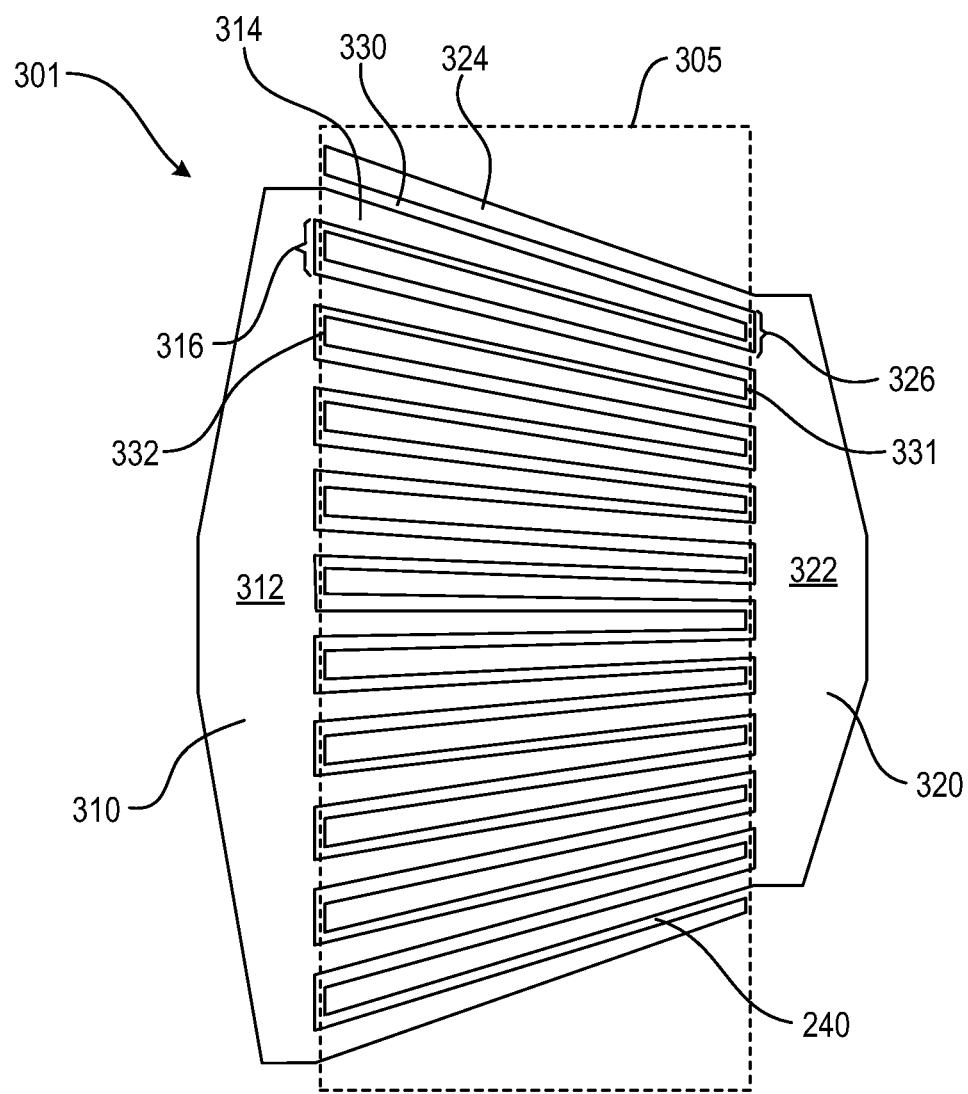
FIG. 3 is a top plan view of an LCRF device having an LCRF with an apodized shape, according to a representative embodiment.

FIG. 3 is a top plan view of an LCRF device having an LCRF with an apodized shape, based on varying electrode finger widths, according to a representative embodiment.

Referring to FIG. 3, LCRF device 300 includes top contour electrode 301, which combines first top comb electrode 310 and second top comb electrode 320. The first top comb electrode 310 includes a first top bus bar 312 and multiple first top comb extensions or comb-like fingers (indicated by representative first top finger 314), which extend in a first direction away from the first top bus bar 312 (e.g., generally left to right in the illustrative orientation). More specifically, proximal ends of the first top fingers 314 are connected to the first top bus bar 312, and separated from one another by first spaces (indicated by representative first space 316). Distal ends of the first top fingers 314 are not connected to any bus bar, such as second top bus bar 322. The second top comb electrode 320 includes the second top bus bar 322 and multiple second top comb extensions or comb-like fingers (indicated by representative second top finger 324), which extend in a second direction away from the second top bus bar 322 (e.g., generally right to left in the illustrative orientation). Proximal ends of the second top fingers 324 are connected to the second top bus bar 322, and separated from one another by second spaces (indicated by representative second space 326). Distal ends of the second top fingers 324 are not connected to any bus bar, such as the first top bus bar 312. In the depicted embodiment, the second direction is substantially opposite the first direction (as opposed to exactly opposite the first direction) because the first and second directions are slightly skewed with respect to one another due to the apodized geometry, as discussed below.

The top contour electrode 301 is interdigital in that the first top fingers 314 of the first top comb electrode 310 extend within the second spaces 326 formed between adjacent second top fingers 324, and the second top fingers 324 of the second top comb electrode 320 extend within the first spaces 316 formed between adjacent first top fingers 314, thereby forming a top interleaving pattern in the top contour electrode 301. As discussed above, the first and second top bus bars 312 and 322 are mass loaded, so that they have different resonance frequencies than the first and second top fingers 314 and 324. Therefore, the top interleaving pattern of the first and second top fingers 314 and 324, located between the mass loaded first and second top bus bars 312 and 322, form an acoustic filter, indicated as resonator filter LCRF 305. That is, the LCRF 305 comprises alternating first and second top fingers 314 and 324 separated lengthwise by gaps 330. Also, since the distal ends of the first and second top fingers 314 and 324 do not contact the second and first top bus bars 322 and 312, respectively, the distal ends of the first top fingers 314 are separated from the second top bus bar 322 by end gaps 331 and the distal ends of the second top fingers 324 are separated from the first top bus bar 312 by end gaps 332.

For purposes of illustration, FIG. 3 depicts a non-limiting example showing eleven first top fingers 314 and eleven second top fingers 324 alternating with the eleven first top fingers 314. Adjacent first and second top fingers 314 and 324 are respectively separated by twenty-one gaps 330. Of course, the numbers of first and second top fingers 314 and 324 and corresponding gaps 330 may vary without departing from the scope of the present teachings.

In the depicted embodiment, the apodized shape of the LCRF 305 is formed by varying the width of at least one of the first top fingers 314 and/or at least one of the second top fingers 324 along a lengthwise direction, while maintaining constant widths of the gaps 330 formed between the first and second top fingers 314 and 324, respectively. That is, the first and second top fingers 314 and 324 have corresponding first and second widths, respectively. The apodized shape therefore may be formed by at least one of the first and second widths being varied along one of the first and second directions. Generally, though, the first and second widths of the first and second top fingers 314 and 324 vary in opposite directions. For example, the first width of the at least one first top finger 314 may decrease as the at least one first top finger 314 extends away from the first top bus bar 312 along the first direction, while the second width of the at least one second top finger 324 may increase as the at least one second top finger 324 extends away from the second top bus bar 322 along the second direction (e.g., as shown in FIG. 3). Alternatively, the first width of the at least one first top finger 314 may increase along the first direction, while the second width of the at least one second top finger 324 may decrease along the second direction.

For purposes of illustration and ease of description, FIG. 3 shows a uniform pattern, where the first and second top fingers 314 and 324 have the same widths and width variations along the lengthwise directions, respectively, and the gaps 330 separating adjacent first and second top fingers 314 and 324 have the same widths along the lengthwise direction. Referring to the example shown in FIG. 3, the first width of each of the first top fingers 314 becomes narrower as first top fingers 314 extend away from the first top bus bar 312 in the first direction, and the second width of each of the second top fingers 324 becomes wider as the second top fingers 324 extend away from the second top bus bar in the second direction. That is, each of the first top fingers 314 is wider near the first top bus bar 312 and narrows linearly in the lengthwise direction as it progresses toward the second top bus bar 322, and each of the second top fingers 324 is narrower near the second top bus bar 322 and widens linearly in the lengthwise direction as it progresses toward the first top bus bar 312. Each of the gaps 330 maintain a constant width lengthwise. Thus, the respective widths of the first and second top fingers 314 and 324, and the rates at which the respective widths vary, are complementary. Also, for purposes of illustration and ease of description, the end gaps 331 and 332 have the same widths. Accordingly, the changing widths of the first and second top fingers 314 and 324 cause the consecutive first and second top fingers 314 and 315 to skew outwardly, such that the side edges of the bottom-most first top finger 314 and the top-most second top finger 324 (corresponding to outer edges of the LCRF 305) are not parallel. Further, the distal ends of each of the first and second top fingers 314 and 324 (also corresponding to outer edges of the LCRF 305) are formed at angles likewise to avoid parallel outside edges, respectively. Accordingly, the LCRF 305 has an apodized shape.

In an illustrative configuration, each of the gaps 330 may have a constant width of approximately 3.0 µm, each of the first top fingers 214 may have a varying width that changes substantially linearly from approximately 6.0 µm at the proximal end (at the first top bus bar 312) to approximately 3.0 µm at the distal end (near the second top bus bar 322), each of the second top fingers 314 may have a varying width that changes substantially linearly from approximately 3.0 µm at the proximal end (at the second top bus bar 322) to approximately 6.0 µm at the distal end (near the first top bus bar 312), and each of the end gaps 331 and 332 may have a width of approximately 2.5 µm. Of course, these dimensions may vary to provide unique benefits for any particular situation or to meet application specific design requirements of various implementations, as would be apparent to one skilled in the art. Of course, the number of first and/or second top fingers 314 and 324 that vary in width, as well as the extent of the variation(s), may differ in various configurations without departing from the scope of the present teachings. Likewise, the widths of the end gaps 331 and 332 may vary, with respect to each other or among themselves, without departing from the scope of the present teachings.

The top contour electrode 301 is formed over a piezoelectric layer 240, portions of which are visible through the gaps 330 in FIG. 3. The piezoelectric layer 240 is formed either on a single bottom electrode or ground plane (not shown) or on a bottom contour electrode (not shown), which combines first and second bottom comb electrodes in a similar manner as described above with regard to the top contour electrode 301.

Figure 4:
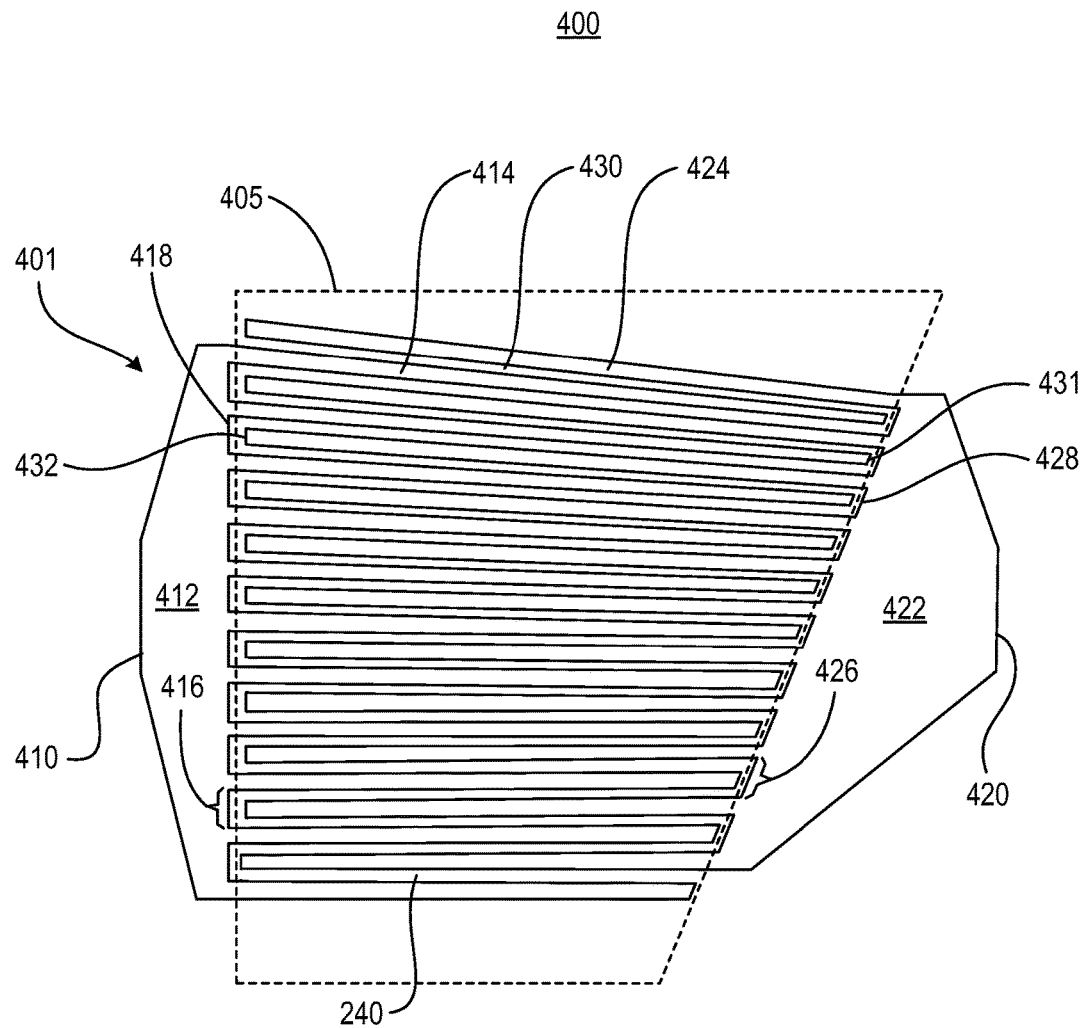
FIG. 4 is a top plan view of an LCRF device having an LCRF with an apodized shape, according to a representative embodiment.

FIG. 4 is a top plan view of an LCRF device having an LCRF with an apodized shape, based on varying bus bar edges, according to a representative embodiment.

Referring to FIG. 4, LCRF device 400 includes top contour electrode 401, which combines first top comb electrode 410 and second top comb electrode 420. The first top comb electrode 410 includes a first top bus bar 412 and multiple first top comb extensions or comb-like fingers (indicated by representative first top finger 414), which extend in a first direction away from the first top bus bar 412 (e.g., generally left to right in the illustrative orientation). More specifically, proximal ends of the first top fingers 414 are connected to the first top bus bar 412, and separated from one another by first spaces (indicated by representative first space 416). Distal ends of the first top fingers 414 are not connected to any bus bar, such as second top bus bar 422. The second top comb electrode 420 includes the second top bus bar 422 and multiple second top comb extensions or comb-like fingers (indicated by representative second top finger 424), which extend in a second direction away from the second top bus bar 422 (e.g., generally right to left in the illustrative orientation). Proximal ends of the second top fingers 424 are connected to the second top bus bar 422, and separated from one another by second spaces (indicated by representative second space 426). Distal ends of the second top fingers 424 are not connected to any bus bar, such as the first top bus bar 412. In the depicted embodiment, the second direction is substantially opposite the first direction (as opposed to exactly opposite the first direction) because the first and second directions are slightly skewed with respect to one another due to the apodized geometry, as discussed below.

The top contour electrode 401 is interdigital in that the first top fingers 414 of the first top comb electrode 410 extend within the second spaces 426 formed between adjacent second top fingers 424, and the second top fingers 424 of the second top comb electrode 420 extend within the first spaces 416 formed between adjacent first top fingers 414, thereby forming a top interleaving pattern in the top contour electrode 401. As discussed above, the first and second top bus bars 412 and 422 are mass loaded, so that they have different resonance frequencies than the first and second top fingers 414 and 424. Therefore, the top interleaving pattern of the first and second top fingers 414 and 424, located between the mass loaded first and second top bus bars 412 and 422, form an acoustic filter, indicated as resonator filter LCRF 405. That is, the LCRF 405 comprises alternating first and second top fingers 414 and 424 separated lengthwise by gaps 430. Also, since the distal ends of the first and second top fingers 414 and 424 do not contact the second and first top bus bars 422 and 412, respectively, the distal ends of the first top fingers 414 are separated from the second top bus bar 422 by end gaps 431 and the distal ends of the second top fingers 424 are separated from the first top bus bar 412 by end gaps 432.

For purposes of illustration, FIG. 4 depicts a non-limiting example showing eleven first top fingers 414 and eleven second top fingers 424 alternating with the eleven first top fingers 414. Adjacent first and second top fingers 414 and 424 are respectively separated by twenty-one gaps 430. Of course, the numbers of first and second top fingers 414 and 324 and corresponding gaps 430 may vary without departing from the scope of the present teachings.

In the depicted embodiment, the apodized shape of the LCRF 405 is formed by varying or skewing a second inner edge 428 of the second top bus bar 422 in relation to a first inner edge 418 of the first top bus bar 412. In the example shown in FIG. 4, the second inner edge 428 of the second top bus bar angles away from the first inner edge 418 of the first top bus bar 412, such that the lengths of the adjacent first and second top fingers 414 and 424 are longer as the progress across the top contour electrode 401 (e.g., generally bottom to top in the illustrative orientation). However, each of the first and second top fingers 414 and 424 maintains a constant width as it extends lengthwise from the first and second top bus bars, respectively. The gaps 430 maintain constant widths at they extend lengthwise between the first and second top fingers 414 and 424. The apodized shape therefore may be formed by skewed angle of the second inner edge 428 of the second top bus 422. Alternatively, the apodized shape may be formed by skewing the angle of the first inner edge 418 of the first top bus 412, or by skewing the angles of both the first and second inner edges 418 and 428, without departing from the scope of the present teachings.

For purposes of illustration and ease of description, FIG. 4 shows a uniform pattern, where each of the first top fingers 414 and the second top fingers 424 has a constant width along the lengthwise directions, and each of the gaps 430 separating adjacent first and second top fingers 414 and 424 has a constant width along the lengthwise direction. Moreover, each of the first and second top fingers 414 and 424 has the same area, so as the length of the first and second top fingers 414 and 424 changes, their respective widths also change accordingly to maintain that same area. The gaps 430 meanwhile have the same widths. Also, for purposes of illustration and ease of description, the end gaps 431 and 432 have the same widths, and are formed at substantially right angles to the sides of the first and second top fingers 414 and 424, respectively. Accordingly, the skewed second inner edge 428 of the second top bus bar 422 causes the consecutive first and second top fingers 414 and 424 to skew outwardly, such that the side edges of the bottom-most first top finger 414 and the top-most second top finger 424 (corresponding to outer edges of the LCRF 405) are not parallel. Further, the distal ends of each of the first and second top fingers 414 and 424 (also corresponding to outer edges of the LCRF 405) are formed at angles likewise to avoid parallel outside edges, respectively. Accordingly, the LCRF 405 has an apodized shape.

In an illustrative configuration, each of the gaps 430 may have a constant width of approximately 3.0 μm, each of the first and second top fingers 414 and 424 may have a constant width of approximately 3.5 μm, and each of the end gaps 431 and 432 may have a width of approximately 2.5 μm. Of course, these dimensions may vary to provide unique benefits for any particular situation or to meet application specific design requirements of various implementations, as would be apparent to one skilled in the art.

The top contour electrode 401 is formed over a piezoelectric layer 240, portions of which are visible through the gaps 430 in FIG. 4. The piezoelectric layer 240 is formed either on a single bottom electrode or ground plane (not shown) or on a bottom contour electrode (not shown), which combines first and second bottom comb electrodes in a similar manner as described above with regard to the top contour electrode 401.

Figure 5:
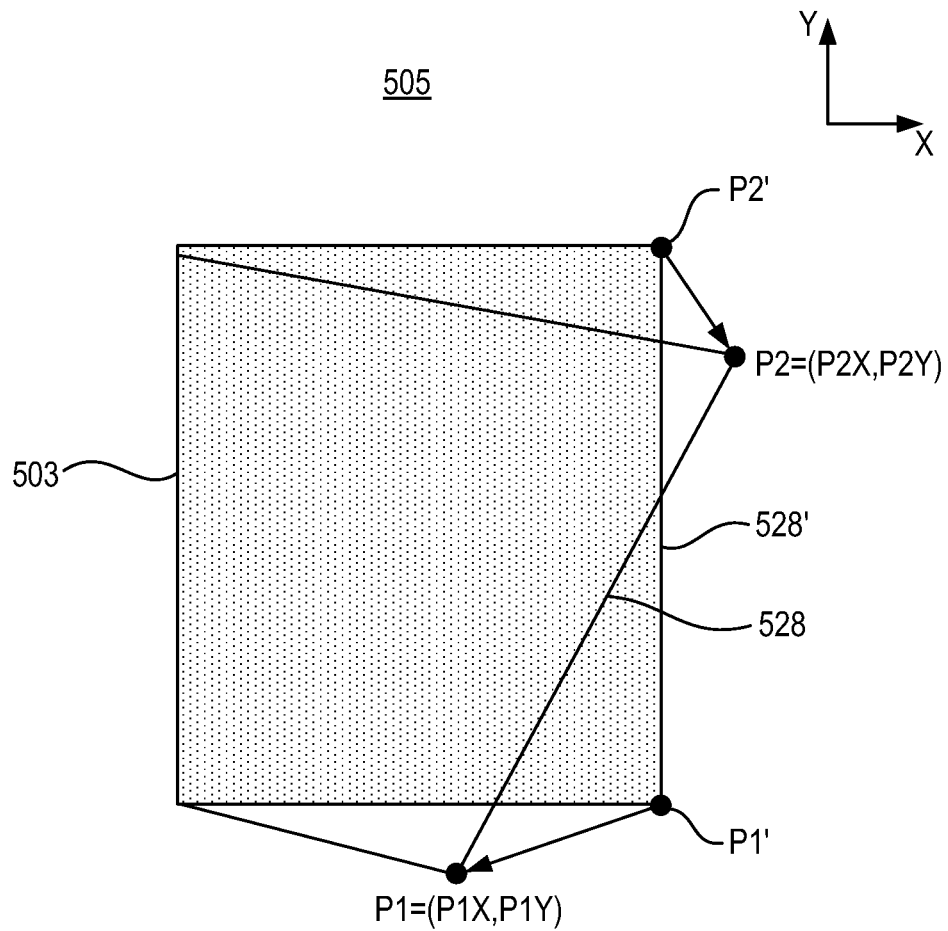
FIG. 5 is a diagram showing a general algorithm for designing an LCRF device having an LCRF with an apodized shape, according to a representative embodiment.

FIG. 5 is a diagram showing a general algorithm for designing an LCRF device having an LCRF with an apodized shape based on skewed inner edges of electrode bus bars, such as LCRF 405 discussed above, according to a representative embodiment.

Referring to FIG. 5, an initial non-apodized contour shape of an LCRF is indicated by reference number 503. For purposes of illustration and ease of description, the initial non-apodized shape 503 is shown as a square, having two sets of parallel edges of the same length. The right edge 528' of the initial non-apodized shape 503 may correspond to the inner edge of a bus bar of a non-apodized LCRF, such as in the LCRF device 100 shown in FIG. 1. The right edge 528' extends between initial lower corner point P1' and initial upper corner point P2'.

In order to obtain an LCRF with an apodized shape, the initial lower corner point P1' is relocated to lower corner point P1, indicated by coordinates (P1X, P1Y), and the initial upper corner point P2' is relocated to upper corner point P2, indicated by coordinates (P2X, P2Y). The respective coordinates maybe user-determined values, for example. In the depicted illustration, the coordinates P1X and P1Y of the lower corner point P1 are both negative numbers (using the initial lower corner point P1' as reference), and the coordinates P2X and P2Y of the upper corner point P2 are positive and negative numbers, respectively (using the initial upper corner point P2' as the reference). A line passing through the lower and upper corner points P1 and P2 may then be computed, the line corresponding to a skewed right edge 528. For example, once the coordinates of the lower and upper corner points P1 and P2 are established, then all other points defining the right side of the LCRF are computed by placing them on the line under the constraint that the area of each finger of the apodized LCRF is fixed and equal to the area of the corresponding finger of an original LCRF having the non-apodized shape 503. The skewed right edge 528 may correspond to an inner edge of a skewed bus bar of the apodized LCRF, such as the second inner edge 428 of the second top bus bar 422 shown in FIG. 4.

Figure 6A:
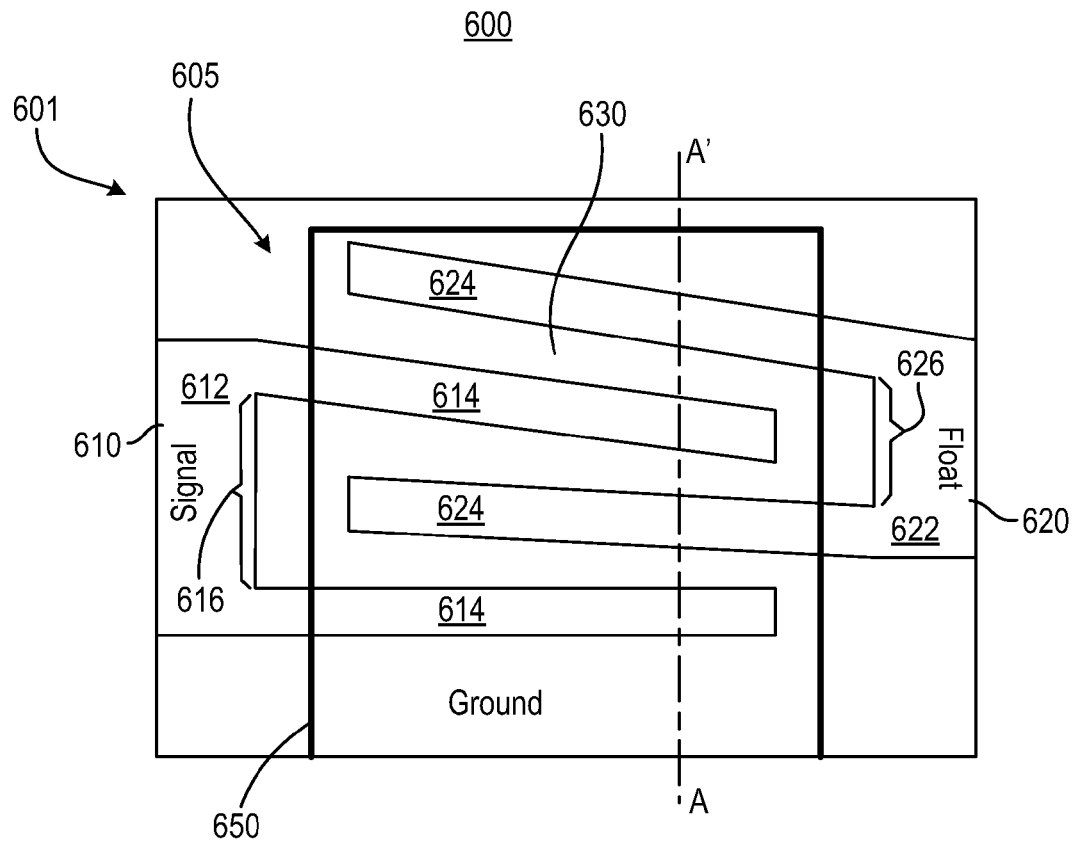
FIG. 6A is a top plan view of an LCRF device having an LCRF with an apodized shape and a planar bottom electrode, according to a representative embodiment.
Figure 6B:
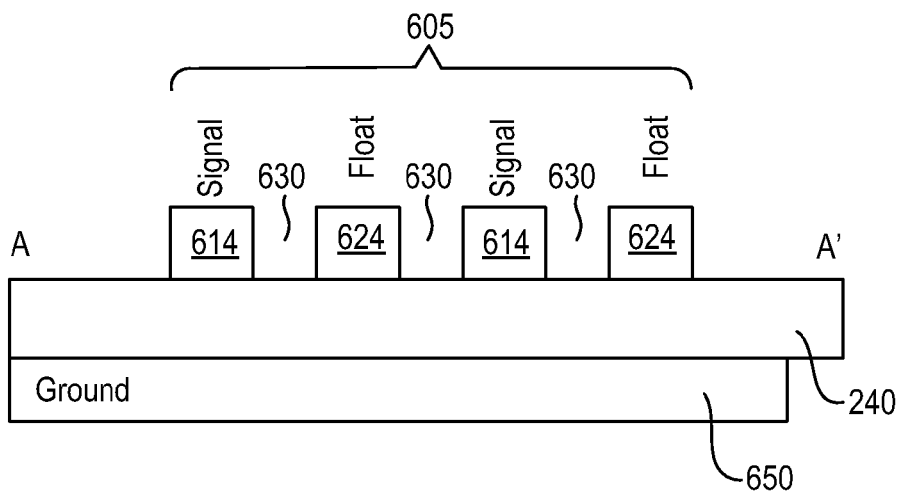
FIG. 6B is a cross-sectional view of the LCRF shown in FIG. 6A, according to a representative embodiment.
Figure 7A:
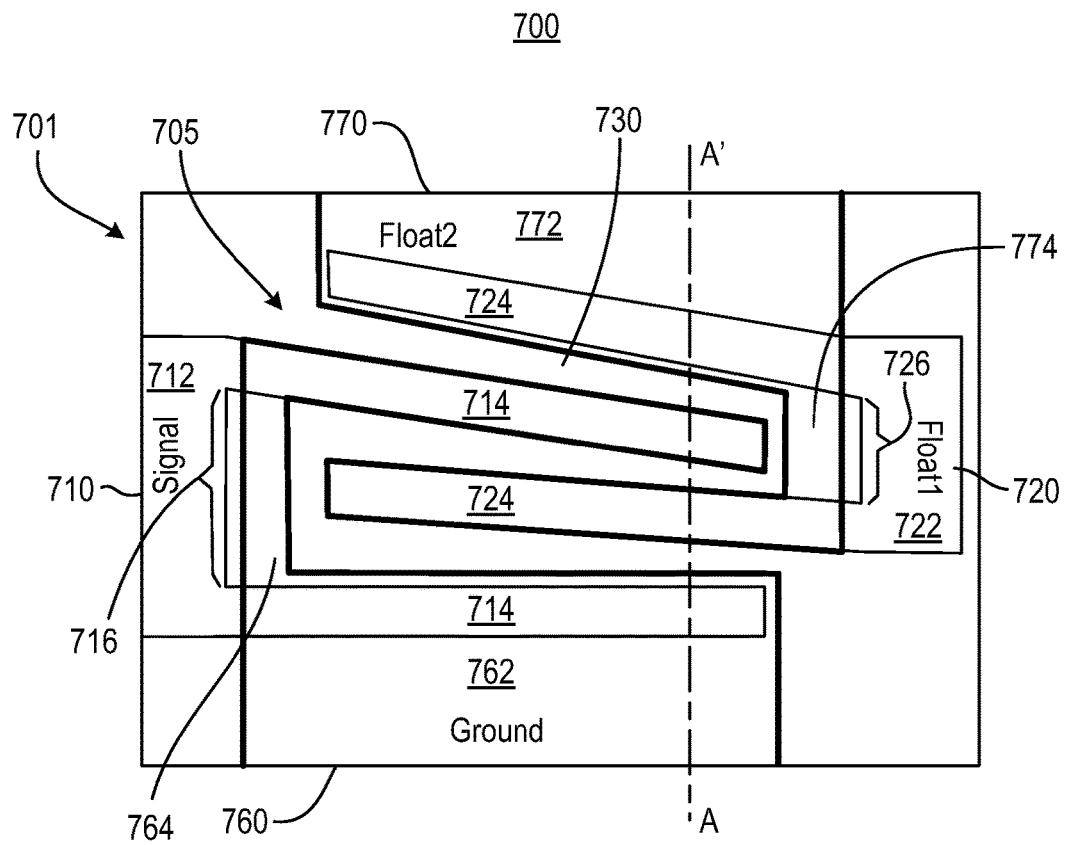
FIG. 7A is a top plan view of an LCRF device having an LCRF with an apodized shape, according to a representative embodiment.
Figure 7B:
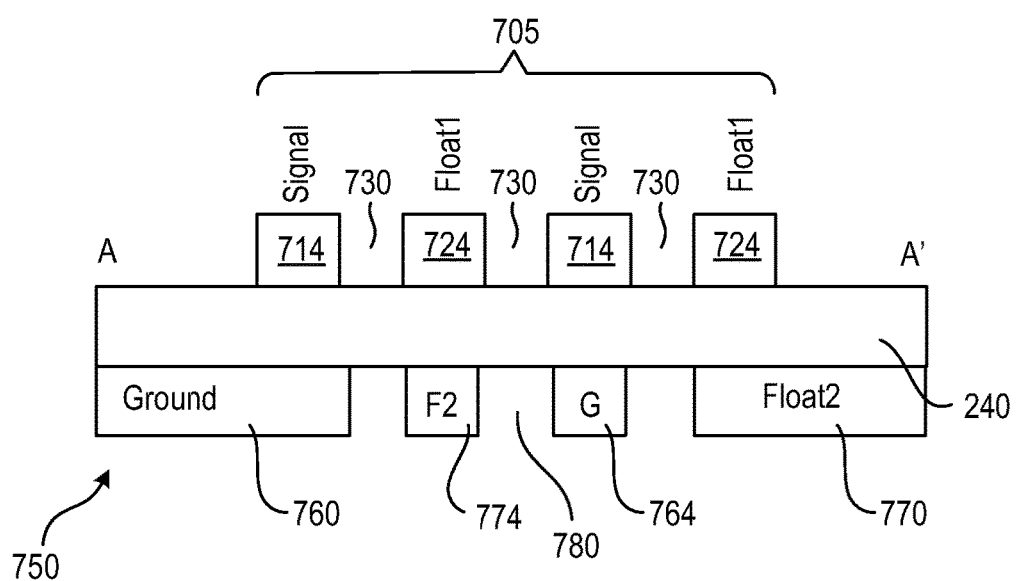
FIG. 7B is a cross-sectional view of the LCRF shown in FIG. 7A, according to a representative embodiment.

FIGS. 6A and 6B are directed to an LCRF device having a single bottom electrode, and FIGS. 7A and 7B are directed to an LCRF device having an interdigital bottom contour electrode, according to representative embodiments. For purposes of illustration and ease of description, the LCRF devices depicted in FIGS. 6A and 6B and FIGS. 7A and 7B have LCRFs with apodized shapes based on varying gap widths, an example of which is discussed above with reference to FIG. 2. However, it is understood that the general descriptions apply to any of the embodiments described herein, e.g., where apodized shaped LCRFs are obtained by varying widths of electrode fingers lengthwise as discussed above with reference to FIG. 3 and/or by skewing LCRF edges (substantially corresponding to inner edges of at least one of the first and second top bus bars) as discussed above with reference to FIGS. 4 and 5.

More particularly, FIG. 6A is a top plan view of an LCRF having a top interleaving pattern of the first and second top fingers having an apodized shape, and FIG. 6B is a cross-sectional view of the LCRF in FIG. 6A taken along line A-A', according to a representative embodiment. FIGS. 6A and 6B thus depict a single-ended filter configuration.

Referring to FIGS. 6A and 6B, LCRF device 600 includes top contour electrode 601, which combines first top comb electrode 610 and second top comb electrode 620. The first top comb electrode 610 includes a first top bus bar 612 and two first top fingers 614 extending in a first direction from the first top bus bar 612. The first top fingers 614 are separated from one another by first space 616. The second top comb electrode 620 includes a second top bus bar 622 and two second top fingers 624 extending in a second direction from the second top bus bar 622, the second direction being substantially opposite to the first direction. The second top fingers 624 are separated from one another by second space 626. The first top fingers 614 extend into the second space 626, and the second top fingers 624 extend into the first space 616 to form a top interleaving pattern corresponding to LCRF 605. The LCRF 605 thus comprises alternating first and second top fingers 614 and 624 separated by gaps 630. As mentioned above, the LCRF 605 has an apodized shape by varying widths of the gaps 630 in a lengthwise direction. However, other means of obtaining an apodized shape, examples of which are described above, may be incorporated without departing from the scope of the present teachings.

In the depicted embodiment, the first top bus bar 612 is labeled "Signal" and the second top bus bar 622 is labeled "Float." This indicates that an electric signal is applied to the first top bus bar 612, which excites Mason mode under the first top fingers 614 of the first top comb electrode 610. As mentioned above, the Mason mode undergoes scattering at edges of the first top comb electrode 610, and produces spurious modes in the first top fingers 614 and the gaps 630. The spurious modes in the gaps 630 propagate to the floating second top fingers 624 of the second top comb electrode 620, exciting motion in the second top fingers 624. That is, motion is excited by stack eigen-modes in the gaps 630 between the first top fingers 614 propagating to the second top fingers 624. Voltage is generated by the excited motion of the piezoelectric layer 240, which is picked up as a transmitted signal.

The top contour electrode 601 is formed on piezoelectric layer 240, which is formed on bottom electrode 650, as shown in FIG. 6B, in particular. When viewed from the top plane as in FIG. 6A, an outline of the bottom electrode 650 is shown (through the top contour electrode 601 and the piezoelectric layer 240) as a contour line. The cross-sections of the interleaved first and second top fingers 614 and 624 are arranged in the order of first top finger 614 (which is a signal carrying electrode finger), gap 630, second top finger 624 (which is a floating electrode finger), gap 630, first top finger 614, gap 630, and second top finger 624. In the depicted embodiment, the bottom electrode 650 is a single electrode that forms a plane on which the piezoelectric layer 240 is formed. The bottom electrode 650 may be a ground plane, for example. Forming the bottom electrode 650 simplifies the fabrication process, since patterning and etching steps need only be performed on the top surface of the piezoelectric layer 240 to form the various features of the top contour electrode 601.

Similarly, FIG. 7A is a top plan view of an LCRF having a top interleaving pattern of the first and second top fingers (and assumed to have an apodized shape), and FIG. 7B is a cross-sectional view of the LCRF in FIG. 7A taken along line A-A', according to a representative embodiment. However, as shown by FIG. 7B, the bottom plane electrode (or ground plane) is replaced with another (bottom) interleaving pattern, as discussed below. FIGS. 7A and 7B thus depict a differential filter configuration.

Referring to FIGS. 7A and 7B, LCRF device 700 includes top contour electrode 701, which combines first top comb electrode 710 and second top comb electrode 720. The first top comb electrode 710 includes a first top bus bar 712 and two first top fingers 714 extending in a first direction from the first top bus bar 712. The first top fingers 714 are separated from one another by first space 716. The second top comb electrode 720 includes a second top bus bar 722 and two second top fingers 724 extending in a second direction from the second top bus bar 722, the second direction being substantially opposite to the first direction. The second top fingers 724 are separated from one another by second space 726. The first top fingers 714 extend into the second space 726, and the second top fingers 724 extend into the first space 716 to form a top interleaving pattern corresponding to LCRF 705. The LCRF 705 thus comprises alternating first and second top fingers 714 and 724 separated by gaps 730. As mentioned above, the LCRF 705 has an apodized shape by varying widths of the gaps 730 in a lengthwise direction. However, other means of obtaining an apodized shape, examples of which are described above, may be incorporated without departing from the scope of the present teachings.

In the depicted embodiment, the first top bus bar 712 is labeled "Signal" and the second top bus bar 722 is labeled "Float1." This indicates that an electric signal is applied to the first top bus bar 712, which excites Mason mode under the first top and bottom fingers 714 and 764, and ultimately results in excited motion in the second top and bottom fingers 724 and 774, as discussed above.

The top contour electrode 701 is formed on piezoelectric layer 240, which is formed on bottom contour electrode 750, as shown in FIG. 7B, in particular, although features of the bottom contour electrode 750 are also shown through the top contour electrode 701 in FIG. 7A. The cross-sections of the interleaved first and second top fingers 714 and 724 are arranged on a top surface of the piezoelectric layer 240 in the order of first top finger 714 (which is a signal carrying electrode finger), gap 730, second top finger 724 (which is a floating electrode finger), gap 730, first top finger 714, gap 730, and second top finger 724.

In the depicted embodiment, the bottom contour electrode 750 also combines multiple comb electrodes, shown as first bottom comb electrode 760 and second bottom comb electrode 770. The first bottom comb electrode 760 includes a first bottom bus bar 762 and one first bottom finger 764 extending away from the first bottom bus bar 762, and then angling beneath one of the first top fingers 714. The second bottom comb electrode 770 includes a second bottom bus bar 772 and one second bottom finger 774 extending away from the second bottom bus bar 772, and then angling beneath one of the second top fingers 724. The first and second bottom fingers 764 and 774 are separated by gap 780, which is substantially the same as gap 730 separating adjacent first and second top fingers 714 and 724, to form a bottom interleaving pattern corresponding to the top contour electrode 701 of LCRF 705. In other words, each first top finger 714 and the first bottom finger 764 have substantially the same shape and are substantially overlapping each other, and each second top finger 724 and second bottom finger 774 also have substantially the same shape and also substantially overlap each other.

The patterned bottom contour electrode 750 may be formed by depositing and patterning a layer of metal material on the formed substrate comprising an air-cavity, for example. The patterned bottom contour electrode 750 may be planarized, the piezoelectric layer 240 may be deposited on the planarized bottom contour electrode 750, and the top contour electrode 701 may be deposited and patterned on the piezoelectric layer 240. For example, in an embodiment, fabrication steps may include etching a cavity (swimming pool) in the substrate, filling the cavity with sacrificial material (e.g., phosphosilicate glass (PSG)), and planarizing the substrate and sacrificial material. A conductive material (e.g., molybdenum (Mo)) is deposited on the planarized substrate and sacrificial material, and patterned to form the bottom fingers. Gaps between the bottom fingers are filled with PSG, for example, and the Mo and PSG are planarized. A piezoelectric material (e.g., aluminum nitride (AlN)) is deposited on the bottom contour electrode 750 to form the piezoelectric layer. A conductive material (e.g., Mo) is deposited on the piezoelectric layer 240, and patterned to form the top fingers. The PSG in the swimming pool is released (releasing the membrane), which also removes the PSG from in-between the bottom fingers, thus creating the electrode patterns of the bottom contour electrode 750 as shown in FIG. 7. Various illustrative fabrication techniques for an air cavity in a substrate are described by U.S. Pat. No. 7,345,410 (Mar. 18, 2008), to Grannen et al., which is hereby incorporated by reference in its entirety.

In the depicted embodiment, the first bottom bus bar 762 is labeled "Ground" and the second bottom bus bar 772 is labeled "Float2." This indicates that the first bottom bus bar 762 is electrically grounded, while the electrical signal is applied to the first top bus bar 712. The electrical signal excites Mason mode between the first top and bottom fingers 714 and 764, and ultimately results in exciting motion in the region where the second top and bottom fingers 724 and 774 overlap. A mechanical motion creates a differential electrical signal in the second top and bottom fingers 724 and 774, which is collected on second top and bottom bus bars 722 and 772 indicated as Float1 and Float2 in FIGS. 7A and 7B, respectively. Because the depicted embodiment includes one metal layer forming the bottom contour electrode 750, for purpose of illustration, the connections to the top contour electrode 701 and the bottom contour electrode 750 are pulled to the top and bottom of the LCRF device 700. Accordingly, the LCRF device 700 includes one apodized LCRF (LCRF 705) contributed to by the top contour electrode 701 and the bottom contour electrode 750.

Also, as mentioned above, in accordance with various embodiments, the LCRF 705 may have an apodized shape, for example, which may be accomplished by simultaneously varying widths of the gaps 730 and 780 in a lengthwise direction, as shown in FIGS. 7A and 7B. However, other means of obtaining an apodized shape, examples of which are described above, may be incorporated without departing from the scope of the present teachings.

Figure 8:
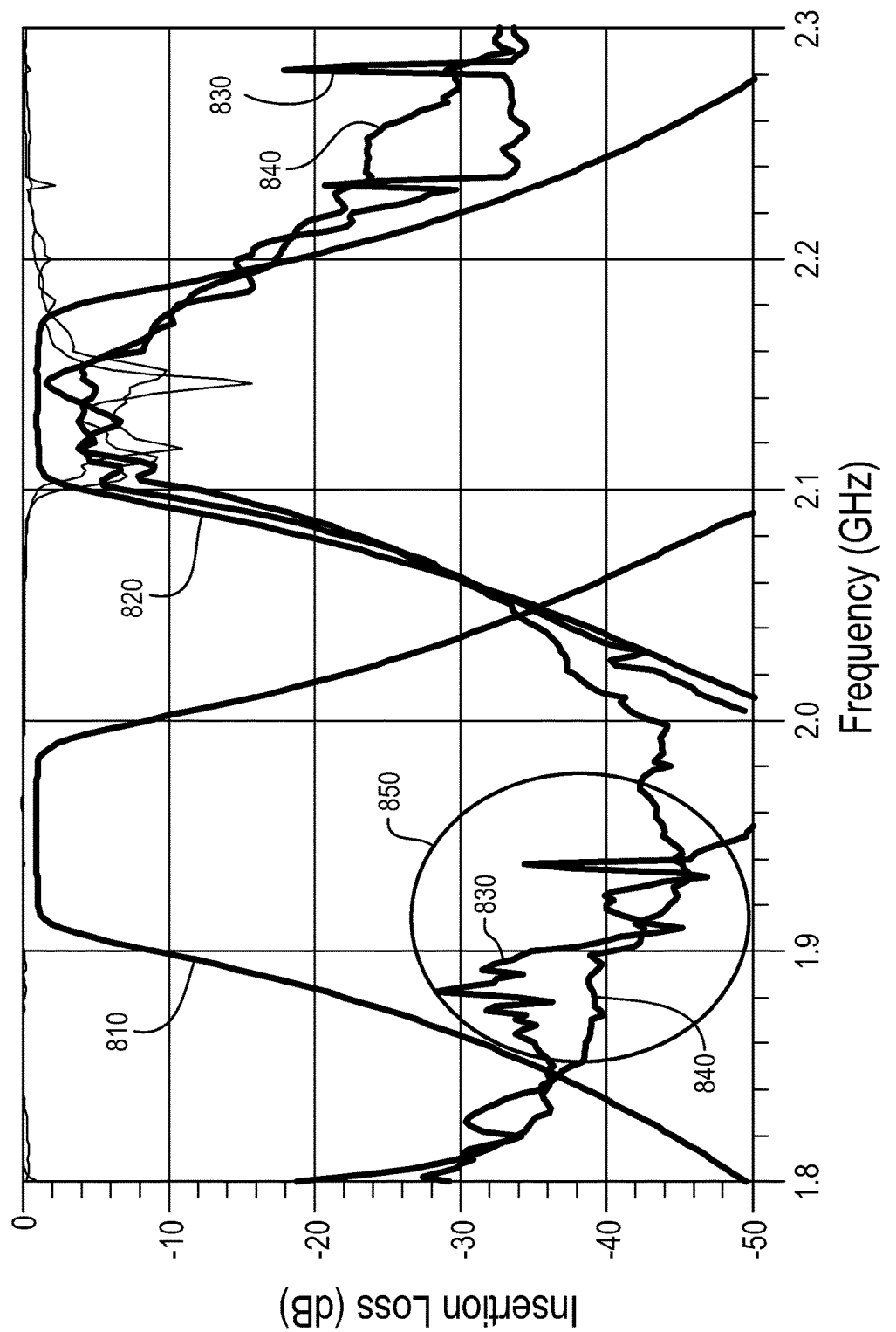
FIG. 8 is a graph illustrating the simulated performance of an acoustic filter comprising two laterally-coupled resonators according to a representative embodiment.

FIG. 8 is a graph illustrating a simulation using 3D Finite Element Method (3D-FEM) Insertion Loss (IL) as a function of frequency of a conventional LCRF as compared to an LCRF having an apodized shape, according to a representative embodiment, in a conventional arrangement of Band-1 receiver (Rx) and transmitter (Tx) pass-bands. That is, FIG. 8 generally illustrates high IL values in an Rx band (pass-band) and low IL values in a Tx band (stop-band) of a conventional, non-apodized LCRF and an apodized LCRF designed to provide RF-signal filtering in front of a Band-1 Rx power amplifier, according to a representative embodiment. IL is represented on the y-axis in decibels (dB), and frequencies of signals input to the LCRFs are represented on the x-axis in GHz.

In the example of FIG. 8, trace 810 indicates an ideal Tx spectrum and trace 820 indicates an ideal Rx spectrum of duplexer filters, for example. Traces 830 and 840 indicate spectra of LCRFs used as receive signal filters, generally passing signals having frequencies in a receive pass-band (e.g., about 2.01 GHz to about 2.28 GHz) and blocking signals having frequencies outside the receive pass-band. The blocked signals generally include signals having frequencies in the transmit pass-band (e.g., about 1.80 GHz to about 2.09 GHz). Trace 830 corresponds to a conventional LCRF and trace 840 corresponds to an LCRF having an apodized shape, according to a representative embodiment.

Each of the LCRF devices used to produce FIG. 8 includes a planar bottom electrode formed of Mo with a thickness of approximately 3000 Å, and a piezoelectric layer formed of AlN with a thickness of approximately 10300 Å. A top contour electrode is formed on the piezoelectric layer, and includes first and second comb electrodes. The first and second comb electrodes include eleven first top fingers and eleven second top fingers extending from first and second top bus bars, respectively, to form an interleaving pattern corresponding to the LCRFs. The first and second top fingers and the first and second top bus bars may be formed of Mo, for example. In the conventional LCRF, each of the first and second top fingers has a width of approximately 3.0 μm, and each gap separating the first and second top fingers has a width of approximately 3.0 μm. In the LCRF having an apodized shape, according to a representative embodiment (e.g., similar to the LCRF 205 discussed above with reference to FIG. 2), each of the first and second top fingers has a (constant) width of approximately 3.0 μm, and each gap separating the first and second top fingers has a width that varies along the lengths of the first and second top fingers from approximately 3.0 μm to approximately 2.5 μm.

As shown by traces 830 and 840 in FIG. 8, the conventional LCRF and the apodized LCRF provide similar pass-bands. However, as shown by trace 830, the conventional LCRF produces a number peaks outside the pass-band (i.e., in the stop-band), particularly in the region indicated by reference number 850. In comparison, as shown by trace 840, the apodized LCRF suppresses these peaks, thus providing more efficient and reliable filtering of unwanted signals coming from the Tx power amplifier.

In various embodiments, the sizes and/or materials of the various features may vary to provide unique benefits for any particular situation or to meet application specific design requirements of various implementations, as would be apparent to one skilled in the art. Also, while various embodiments are disclosed herein, one of ordinary skill in the art would appreciate that many variations that are in accordance with the present teachings are possible and remain within the scope of the appended claim set. Therefore, it should be understood that the above embodiments are not limiting, but illustrative.

What is claimed:

1. A laterally coupled resonator filter device, comprising:
   a bottom electrode;
   a piezoelectric layer disposed on the bottom electrode; and
   a top contour electrode disposed on the piezoelectric layer, the top contour electrode comprising:
      a first top comb electrode comprising a first top bus bar and a plurality of first top fingers extending in a first direction from the first top bus bar; and
      a second top comb electrode comprising a second top bus bar and a plurality of second top fingers extending in a second direction from the second top bus bar, the second direction being substantially opposite to the first direction such that the plurality of first top fingers and the plurality of second top fingers form a top interleaving pattern providing an acoustic filter having an apodized shape,
   wherein the plurality of first top fingers and the plurality of second top fingers have first and second widths, respectively, and wherein the apodized shape of the acoustic filter is formed by at least one of the first and second widths increasing along a corresponding one of the first and second directions.

2. The device of claim 1, wherein the first and second top bus bars are mass loaded, so that the first and second top bus bars have resonance frequencies different from a resonance frequency of the first and second top fingers forming the top interleaving pattern.

3. The device of claim 1, wherein the bottom electrode comprises a ground plane, such that the laterally coupled resonator filter device is a single-ended filter.

4. The device of claim 1, wherein the bottom electrode comprises:
   a first bottom comb electrode comprising a first bottom bus bar and at least one first bottom finger extending in the first direction substantially parallel to at least one of the plurality of first top fingers; and
   second bottom comb electrode comprising a second bottom bus bar and at least one second bottom finger extending in the second direction substantially parallel to at least one of the plurality of the second top fingers, such that the first and second bottom fingers form a bottom interleaving pattern substantially overlapping the top interleaving pattern and providing the acoustic filter having the apodized shape.

5. The device of claim 4, wherein the laterally coupled resonator filter device is a differential filter.

6. A laterally coupled resonator filter device, comprising:
   a bottom electrode;
   a piezoelectric layer disposed on the bottom electrode; and
   a top contour electrode disposed on the piezoelectric layer, the top contour electrode comprising:
      a first top comb electrode comprising a first top bus bar and a plurality of first top fingers extending in a first direction from the first top bus bar; and
      a second top comb electrode comprising a second top bus bar and a plurality of second top fingers extending in a second direction from the second top bus bar, the second direction being substantially opposite to the first direction such that the plurality of first top fingers and the plurality of second top fingers form a top interleaving pattern providing an acoustic filter having an apodized shape,
   wherein the plurality of first top fingers and the plurality of second top fingers are separated by gaps, respectively, and wherein the apodized shape of the acoustic filter is formed by at least one gap varying in width between adjacent first and second top fingers along one of the first and second directions.

7. A laterally coupled resonator filter device, comprising:
   a bottom electrode;
   a piezoelectric layer disposed on the bottom electrode; and
   a top contour electrode disposed on the piezoelectric layer, the top contour electrode comprising:
      a first top comb electrode comprising a first top bus bar and a plurality of first top fingers extending in a first direction from the first top bus bar; and
      a second top comb electrode comprising a second top bus bar and a plurality of second top fingers extending in a second direction from the second top bus bar, the second direction being substantially opposite to the first direction such that the plurality of first top fingers and the plurality of second top fingers form a top interleaving pattern providing an acoustic filter having an apodized shape,
   wherein the first top comb electrode is a signal electrode to which an electrical signal is applied, and the second top comb electrode is a floating electrode, and wherein stack eigen-modes in gaps between the first top fingers propagate to the second top fingers, exciting motion in the second top fingers of the second top electrode.

8. The device of claim 7, wherein the plurality of first top fingers and the plurality of second top fingers have first and second widths, respectively, and
   wherein the apodized shape of the acoustic filter is formed by at least one of the first and second widths varying along a corresponding one of the first and second directions.

9. The device of claim 8, wherein the at least one of the first and second widths increases in the corresponding one of the first and second directions.

10. The device of claim 8, wherein the at least one of the first and second widths decreases in the corresponding one of the first and second directions.

11. A laterally coupled resonator filter device, comprising:
   a ground plane;
   a piezoelectric layer disposed on the ground plane; and
   a top contour electrode disposed on the piezoelectric layer, the top contour electrode comprising a set of interlaced first and second comb-like fingers extending from first and second bus bars, respectively, the first comb-like fingers being configured to receive an electrical signal and the second comb-like fingers configured to resonate in response to the first comb-like fingers receiving the electrical signal,
   wherein the set of interlaced first and second comb-like fingers has an apodized shape resulting from at least one of gaps varying lengthwise between adjacent first and second comb-like fingers, widths of the first and second comb-like fingers varying lengthwise, and skewed edges of at least one of the first and second bus bars.

12. The device of claim 11, wherein the first and second bus bars are mass loaded, so that the first and second bus bars have resonance frequencies different from a resonance frequency of the set of interlaced first and second comb-like fingers.

13. The device of claim 12, wherein the first comb-like fingers are configured to excite Mason modes under the first comb-like fingers in response to the received electrical signal, and the second comb-like fingers are configured to resonate in response to spurious modes produced by edges of the top contour electrode in response to the Mason modes.

14. A laterally coupled resonator filter (LCRF) device, comprising:
    a plurality of first top fingers extending away from a first top bus bar of a first top comb electrode formed over a piezoelectric layer, adjacent first top fingers of the plurality of first top fingers being separated by first spaces, respectively; and
    a plurality of second top fingers extending away from a second top bus bar of a second top comb electrode formed over the piezoelectric layer, adjacent second top fingers of the plurality of second top fingers being separated by second spaces, respectively,
    wherein the first top fingers extend from the first top bus bar into the second spaces between the adjacent second top fingers, and the second top fingers extend from the second top bus bar into the first spaces between the adjacent first top fingers to form a top interleaving pattern having an apodized shape,
    wherein the apodized shape is formed by varying widths of gaps in a lengthwise direction formed between adjacent first top fingers and second top fingers.

15. The device of claim 14,
    wherein the first and second top bus bars are mass loaded, so that the first and second top bus bars have resonance frequencies different from a resonance frequency of the top interleaving pattern of first and second comb-like fingers.

16. The device of claim 14, wherein the first top comb electrode is a signal electrode to which an electrical signal is applied, and the second top comb electrode is a floating electrode.

17. A laterally coupled resonator filter (LCRF) device, comprising:
    a plurality of first top fingers extending away from a first top bus bar of a first top comb electrode formed over a piezoelectric layer, adjacent first top fingers of the plurality of first top fingers being separated by first spaces, respectively; and
    a plurality of second top fingers extending away from a second top bus bar of a second top comb electrode formed over the piezoelectric layer, adjacent second top fingers of the plurality of second top fingers being separated by second spaces, respectively,
    wherein the first top fingers extend from the first top bus bar into the second spaces between the adjacent second top fingers, and the second top fingers extend from the second top bus bar into the first spaces between the adjacent first top fingers to form a top interleaving pattern having an apodized shape, and
    wherein the apodized shape is formed by skewing an inner edge of the second top bus bar, from which the second top fingers extend, in relation to an inner edge of the first top bus bar, from which the first top fingers extend.

18. The device of claim 17, wherein the first and second top bus bars are mass loaded, so that the first and second top bus bars have resonance frequencies different from a resonance frequency of the first and second top fingers forming the top interleaving pattern.

19. The device of claim 17, wherein the apodized shape is further formed by skewing the inner edge of the first top bus bar, from which the first top fingers extend, in addition to skewing the inner edge of the second top bus bar.

* * * * *